United States Patent
Lin et al.

(10) Patent No.: US 7,906,374 B2
(45) Date of Patent: Mar. 15, 2011

(54) COF PACKAGING STRUCTURE, METHOD OF MANUFACTURING THE COF PACKAGING STRUCTURE, AND METHOD FOR ASSEMBLING A DRIVER IC AND THE COF PACKAGING STRUCTURE THEREOF

(75) Inventors: Chiu-Shun Lin, Tainan County (TW); Pai-Sheng Cheng, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 496 days.

(21) Appl. No.: 12/057,387

(22) Filed: Mar. 28, 2008

(65) Prior Publication Data
US 2009/0206472 A1    Aug. 20, 2009

Related U.S. Application Data

(60) Provisional application No. 61/029,377, filed on Feb. 18, 2008.

(51) Int. Cl.
*H01L 21/00* (2006.01)
(52) U.S. Cl. ......... 438/121; 257/E21.521; 257/E21.003; 257/E23.012

(58) Field of Classification Search .................. 257/678, 257/699, E21.003, E21.521, E23.012; 438/16, 438/121
See application file for complete search history.

(56) References Cited

U.S. PATENT DOCUMENTS
2006/0170092 A1 *  8/2006  Kim et al. ............... 257/690

FOREIGN PATENT DOCUMENTS
| JP | 2004207550 A | 7/2004 |
| JP | P2004214430 A | 7/2004 |
| KR | 1020060119937 | 11/2006 |
| WO | 2005027221 A1 | 3/2005 |

* cited by examiner

*Primary Examiner* — Tom Thomas
*Assistant Examiner* — Monica D Harrison
(74) *Attorney, Agent, or Firm* — Winston Hsu; Scott Margo

(57) ABSTRACT

A COF packaging structure includes a substrate, a first conductive foil, and a second conductive foil. The substrate has a first surface and a second surface opposite to the first surface. The first conductive foil is disposed on the first surface of the substrate and has a first designated pattern for bump bonding. The second conductive foil is disposed on the second surface of the substrate and has a second designated pattern, wherein the area of the second designated pattern is not smaller than the area of the first designated pattern.

4 Claims, 10 Drawing Sheets

(1A)

(1B)

(4A)

(4B)

COF PACKAGING STRUCTURE, METHOD OF MANUFACTURING THE COF PACKAGING STRUCTURE, AND METHOD FOR ASSEMBLING A DRIVER IC AND THE COF PACKAGING STRUCTURE THEREOF

CROSS REFERENCE TO RELATED APPLICATIONS

This application claims the benefit of U.S. Provisional Application No. 61/029,377, filed Feb. 18, 2008, and included herein by reference.

BACKGROUND OF THE INVENTION

1. Field of the Invention

The present invention relates to a COF packaging structure and related method, and more particularly, to a COF packaging structure considering thermal dissipation and TCP assembly process by respectively disposing two metal foils each with a designated pattern on two surfaces of a substrate of the COF packaging structure and a related method.

2. Description of the Prior Art

In the past, driver ICs of TFT-LCD panels must carefully consider the tape carrier package (TCP). However, because of lower cost, fine pitch, flexibility, and capable of carrying passive elements, the ratio of the driver ICs adopting chip-on-glass (COG) packaging and chip-on-film (COF) packaging in large TFT-LCD panels has increased. Therefore, the market requirements for driver ICs with COG and COF packaging are becoming more demanding.

Due to requirements for higher frame frequency, driving voltage, and higher display channel of the TFT-LCD panels, a driver IC's thermal dissipation capability is becoming more and more critical. One solution for enhancing the thermal dissipation capability is a COF packaging structure is with two metal layers. Please refer to FIG. 1 together with FIG. 2. FIG. 1 is a diagram of COF packaging structures according to the prior art, and FIG. 2 is a diagram showing thermal dissipation of the COF packaging structures shown in FIG. 1. As shown in 1A, a COF packaging structure 100 includes a substrate 110, a first metal foil 120, and a solder resist layer 130. The substrate 110 is composed of polyimide (PI) film, and the first metal foil 120 is disposed on a first surface 112 of the substrate 110. The solder resist layer 130 is covered on the first metal foil 120. In addition, a driver IC 140 is bonded on the COF packaging structure 100, wherein bumps 142 of the driver IC 140 are bonded on a first designated pattern 122 of the first metal foil 120. As shown in 1B, a COF packaging structure 150 is similar to the COF packaging structure 100, and the difference between them is that the COF packaging structure 150 further includes a second metal foil 160 disposed on a second surface 114 opposite to the first surface 112 of the substrate 110. As shown in FIG. 2, the temperature of the driver IC 140 with the COF packaging structure 150 is much lower than that with the COF packaging structure 100. Therefore, the thermal dissipation capability of the COF packaging structure 150 can be improved by adding the second metal foil 160.

Although the thermal dissipation capability of the COF packaging structure 150 can be improved by adding the second metal foil 160, however, it is also necessary to consider its feasibility in the TCP assembly process. As shown in 1B, because the second metal foil 160 is fully covered on the second surface 114 of the substrate 110, a conventional IL (inner lead) bonder with only one charge coupled device (CCD) is not suitable for the COF packaging structure 150 due to the CCD being unable to see through the COF packaging structure 150. As a result, a new IL bonder with two CCDs would be necessary for the COF packaging structure 150, resulting in higher costs during the TCP assembly process.

SUMMARY OF THE INVENTION

It is one of the objectives of the claimed invention to provide a chip on film (COF) packaging structure and related method to solve the abovementioned problems.

According to one embodiment, a COF packaging structure is provided. The COF packaging structure includes a substrate, a first conductive foil, and a second conductive foil. The substrate has a first surface and a second surface opposite to the first surface. The first conductive foil is disposed on the first surface of the substrate and has a first designated pattern for bump bonding. The second conductive foil is disposed on the second surface of the substrate and has a second designated pattern, wherein an area of the second designated pattern is not smaller than an area of the first designated pattern.

According to one embodiment, a method of manufacturing a COF packaging structure is provided. The method includes providing a substrate having a first surface and a second surface opposite to the first surface; disposing a first conductive foil on the first surface of the substrate, wherein the first conductive foil has a first designated pattern for bump bonding; and disposing a second conductive foil on the second surface of the substrate, wherein the second conductive foil has a second designated pattern, and an area of the second designated pattern is not smaller than an area of the first designated pattern.

According to one embodiment, a method for assembling an integrated circuit (IC) and a COF packaging structure is provided. The method includes providing the driver IC the and the COF packaging structure having a substrate, a first conductive foil, and a second conductive foil, wherein the substrate has a first surface and a second surface opposite to the first surface, the first conductive foil is disposed on the first surface of the substrate and has a first designated pattern for bump bonding, and the second conductive foil is disposed on the second surface of the substrate and has a second designated pattern having an area not smaller than an area of the first designated pattern; utilizing a stage to carry the driver IC; utilizing a charge coupled device (CCD) to watch the COF packaging structure, and utilizing the CCD to watch the driver IC through the first designated pattern and the second designated pattern for calibrating the driver IC; and bonding the driver IC on the COF packaging structure, wherein bumps of the driver IC are bonded on the first designated pattern of the first conductive foil.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 3:
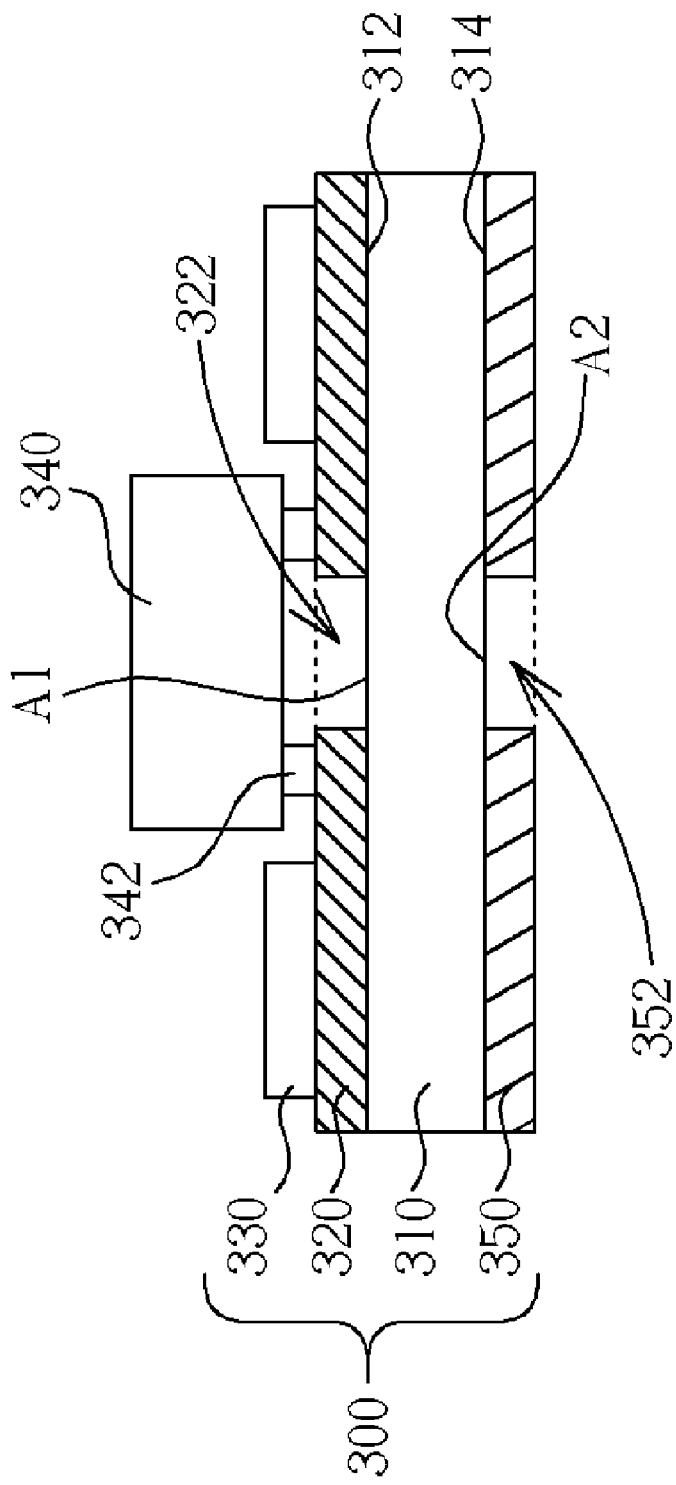
FIG. 3 is a diagram of a COF packaging structure according to an embodiment of the present invention.

Please refer to FIG. 3, which is a diagram of a COF packaging structure 300 according to an embodiment of the present invention. The COF packaging structure 300 includes (but is not limited to) a substrate 310, a first conductive foil 320, a second conductive foil 350, and a solder resist layer 330. The substrate 310 has a first surface 312 and a second surface 314 opposite to the first surface 312. The first conductive foil 320 is disposed on the first surface 312 of the substrate 310 and has a first designated pattern 322 for bump bonding. The second conductive foil 350 is disposed on the second surface 314 of the substrate 310 and has a second designated pattern 352. The solder resist layer 330 is covered on the first conductive foil 320. In addition, a driver IC 340 is bonded on the COF packaging structure 300, wherein bumps 342 of the driver IC are bonded on the first designated pattern 322 of the first conductive foil 320. Compared with the COF packaging structure 150 in 1B, the second conductive foil 350 further includes the second designated pattern 352, wherein an area of the second designated pattern 352 is not smaller than an area of the first designated pattern 322. By adding the second designated pattern 352 into the second conductive foil 350, the COF packaging structure 300 can be seen-through by a CCD. Therefore, the conventional IL (inner lead) bonder with only one charge coupled device (CCD) is suitable for the COF packaging structure 300, which reduces cost during the TCP assembly process.

Please note that the projection area A1 of the first designated pattern 322 on the substrate 310 is within the projection area A2 of the second designated pattern 352 on the substrate 310. In one embodiment where the first designated pattern 322 is identical to the second designated pattern 352, the projection area A1 is identical to the projection area A2. In another embodiment where the first designated pattern 322 is smaller than the second designated pattern 352, the projection area A1 is within the projection area A2.

Please also note that the abovementioned substrate 310 can be composed of PI (polyimide) film, but is not limited to this and can comprise substrates of other types. The first conductive foil 320 and the second conductive foil 350 can be composed of a metallic material such as copper, but should not be construed as a limitation of the present invention. In addition, the shape and the size of the second designated pattern 352 are not limited, and various designs of the second designated pattern 352 are detailed in the following figures and embodiments.

Figure 4:
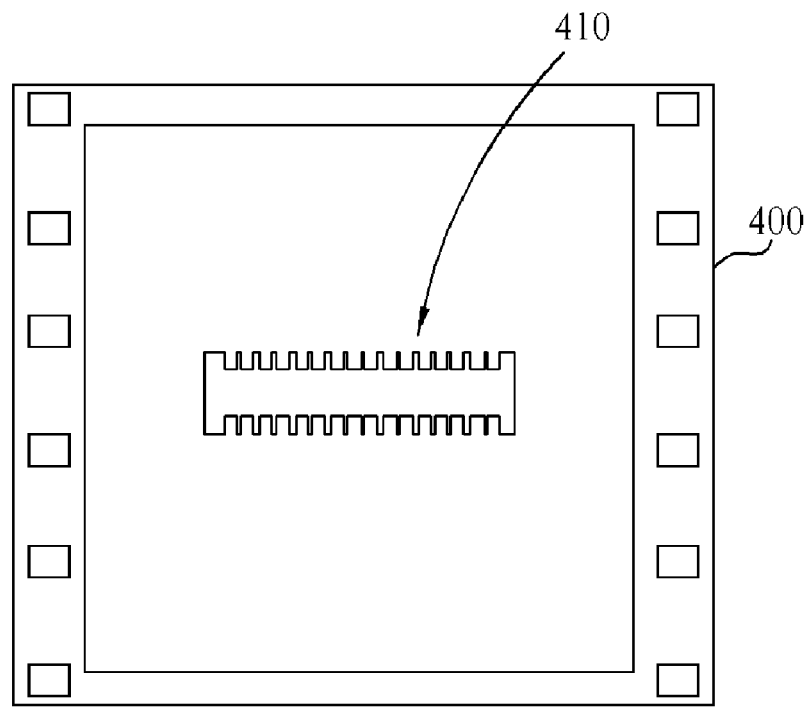
FIG. 4 is a bottom view of examples of the second designated pattern of the second conductive foil shown in FIG. 3.
Figure 4:
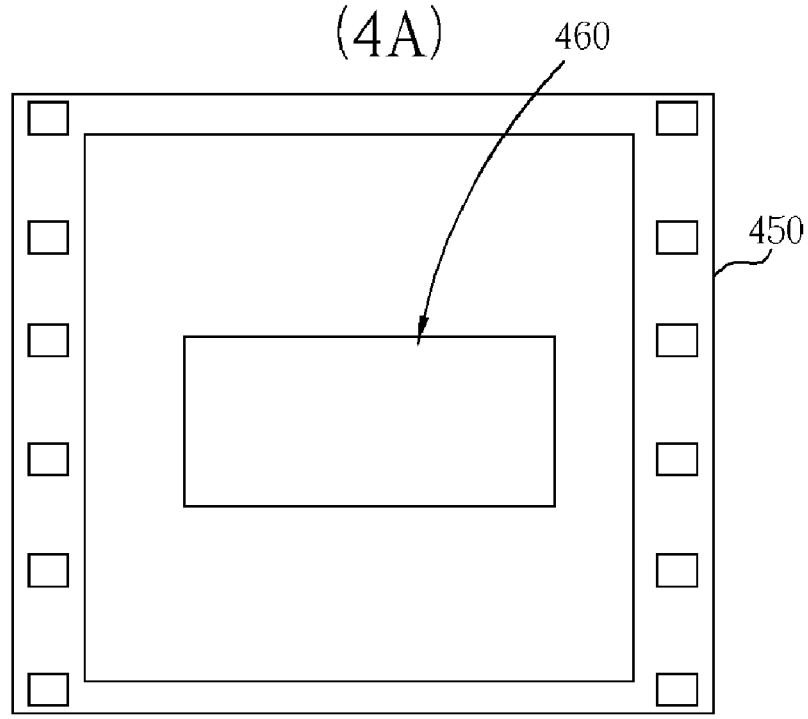

Please refer to FIG. 4. FIG. 4 is a bottom view of examples of the second designated pattern 352 of the second conductive foil 350 shown in FIG. 3. As shown in 4A, a second conductive foil 400 includes a second designated pattern 410, wherein the second designated pattern 410 is identical to the first designated pattern 322 of the first conductive foil 320 shown in FIG. 3. As shown in 4B, a second conductive foil 450 includes a second designated pattern 460, wherein the second designated pattern 460 is different from the first designated pattern 322 of the first conductive foil 320 shown in FIG. 3 and has an area greater than the area of the first designated pattern 322. In these two embodiments, the second conductive foil is fully covered on the second surface of the substrate except for the second designated pattern, therefore optimizing the thermal dissipation capability of the COF packaging structure. As shown in FIG. 4, the shape and the size of the second designated pattern are not limited. Those skilled in the art should appreciate that various modifications of the second designated pattern may be made without departing from the spirit of the present invention, and should also belong to the scope of the present invention.

Figure 5:
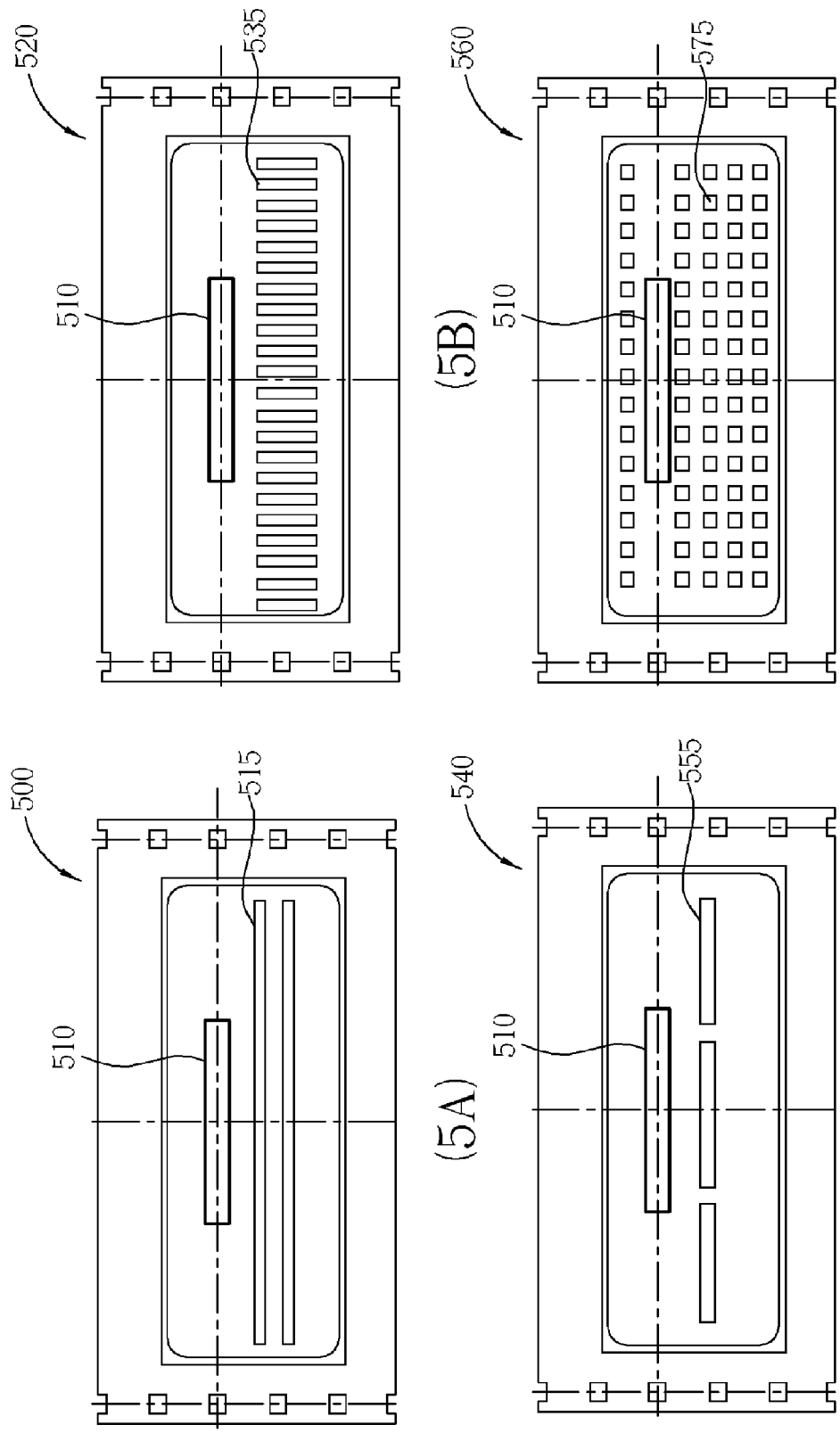
FIG. 5 is a bottom view of examples of the second conductive foil in FIG. 4 according to an embodiment of the present invention.

The second conductive foils 400 and 450 shown in FIG. 4 are merely embodiments of the present invention and, as is well known by persons of ordinary skill in the art, suitable variations can be applied to the second conductive foils. Please refer to FIG. 5. FIG. 5 is a bottom view of examples of the second conductive foil in FIG. 4 according to an embodiment of the present invention, which shows several varied embodiments of the second conductive foil shown in FIG. 4. As shown in 5A, the architecture of the second conductive foil 500 is similar to that in FIG. 4, the difference being that the second conductive foil 500 further includes one or more holes 515 in addition to a second designated pattern 510 (can be implemented by the second designated pattern 410 or 460 shown in FIG. 4), wherein the holes 515 are slender and parallel to the second designated pattern 510. As shown in 5B, the architecture of a second conductive foil 520 is similar to that of the second conductive foil 500 shown in 5A, the difference being that one or a plurality of holes 535 included in the second conductive foil 520 are slender but perpendicular to the second designated pattern 510. As shown in 5C, the architecture of a second conductive foil 540 is similar to that of the second conductive foil 500 shown in 5A, the difference being the number, size, and location of one or a plurality of holes 555 included by the second conductive foil 540 (different from those of holes 515). As shown in 5D, the architecture of a second conductive foil 560 is similar to that of the second conductive foil 500 shown in 5A, and the difference between them is that one or a plurality of holes 575 included by the second conductive foil 560 are square.

As shown in FIG. 5, the shape, number, size, and location of the holes included by the second conductive foil are not limited. Those skilled in the art should appreciate that various modifications of the holes included by the second conductive foil may be made without departing from the spirit of the present invention, which should also belong to the scope of the present invention. In addition, the holes can be used for easily attaching elements or objects with different shapes on the substrate (such as PI film) because the elements or objects are not easily attached on the second conductive foil (such as copper).

Figure 1:
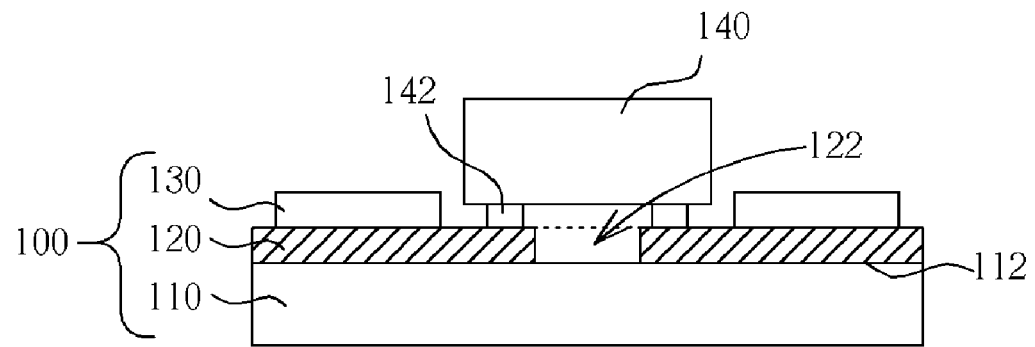
FIG. 1 is a diagram of COF packaging structures according to the prior art.
Figure 1:
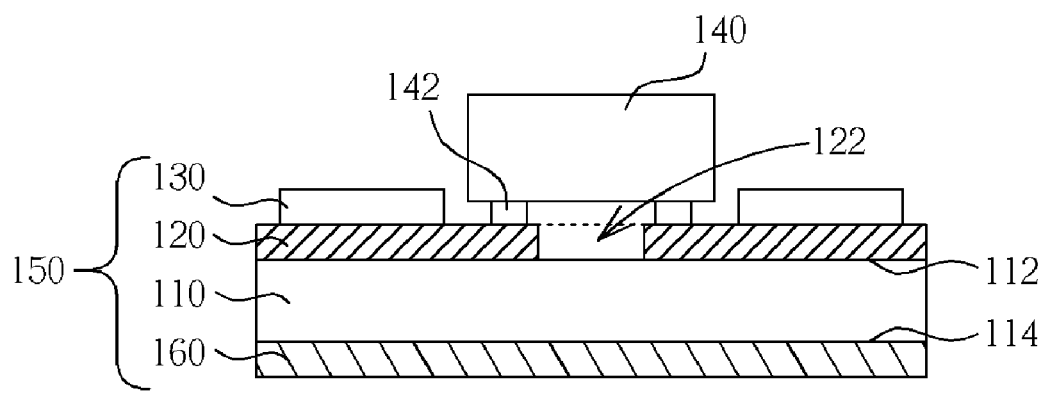
Figure 2:
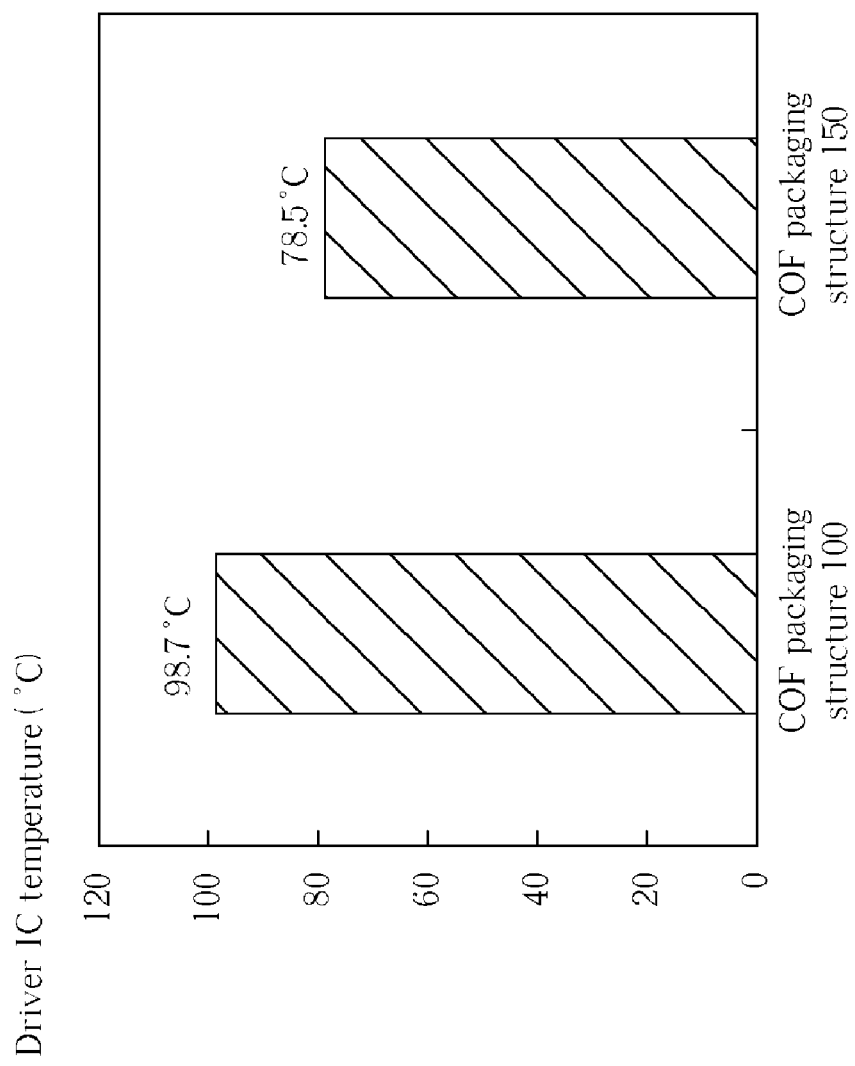
FIG. 2 is a diagram showing the thermal dissipation of the COF packaging structures shown in FIG. 1.
Figure 6:
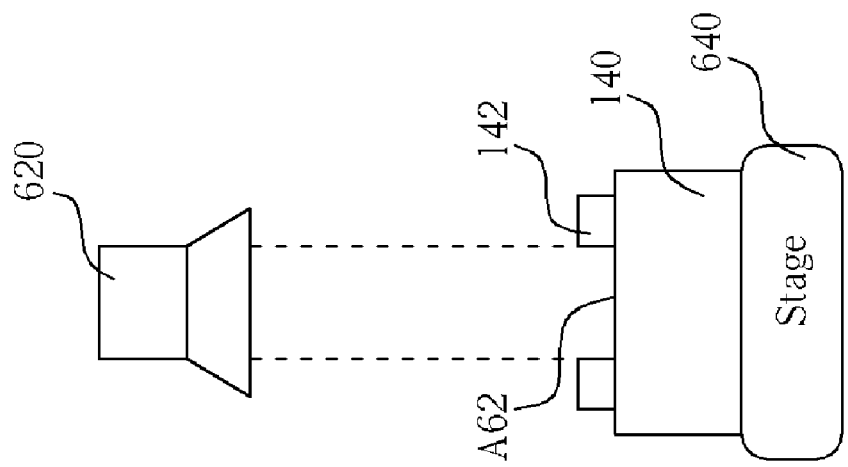
FIG. 6 is a diagram showing the TCP assembly process for the COF packaging structure shown in 1B of FIG. 1.
Figure 6:
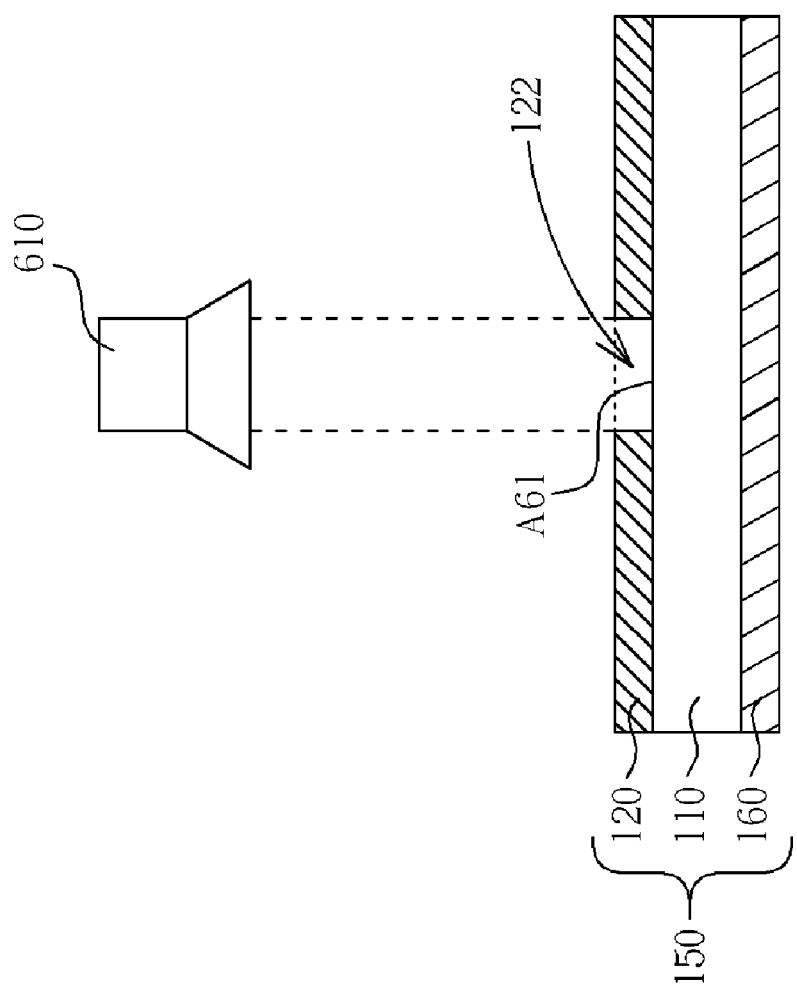
Figure 7:
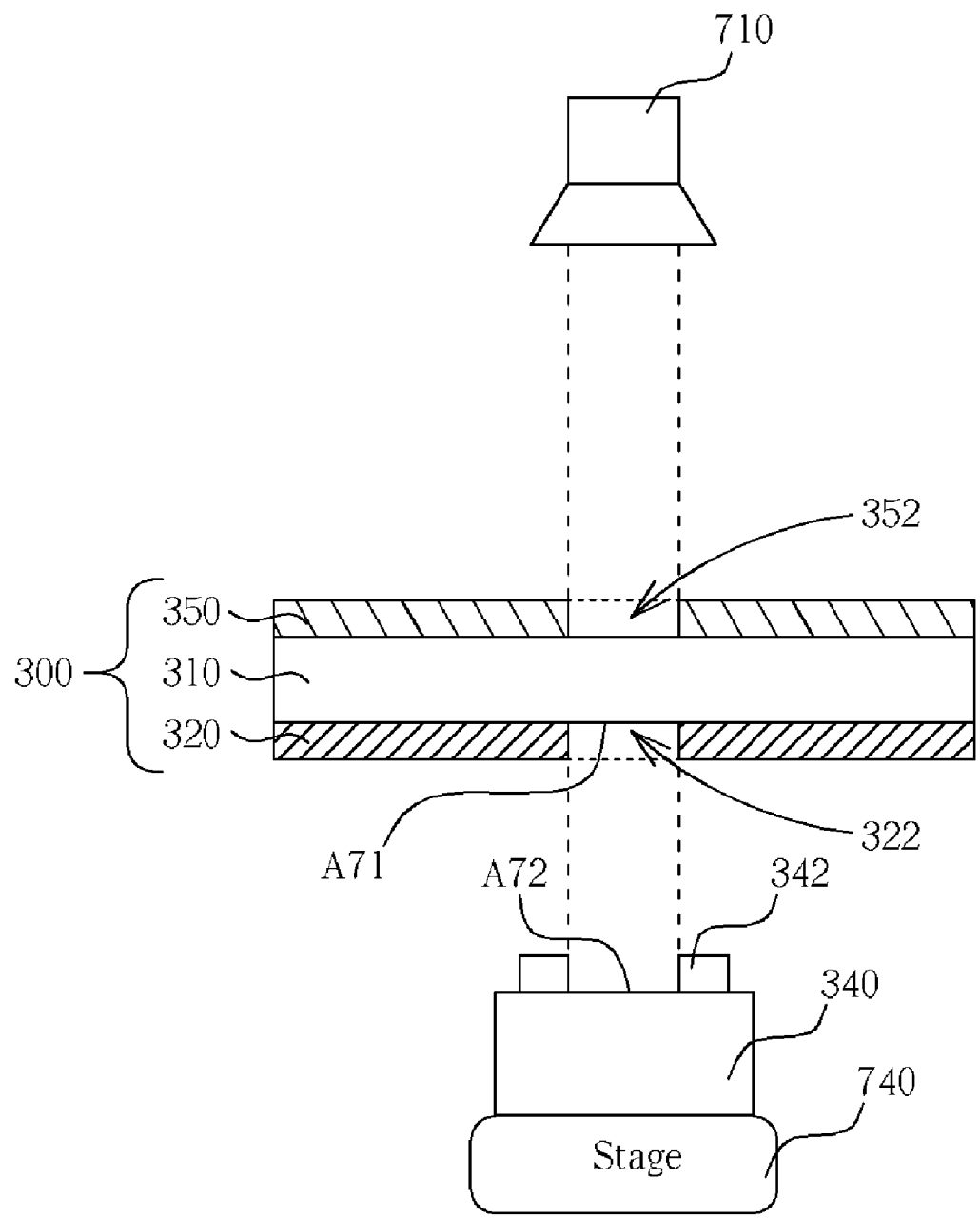
FIG. 7 is a diagram showing the TCP assembly process for the COF packaging structure shown in FIG. 3.

Please refer to FIG. 6 together with FIG. 7. FIG. 6 is a diagram showing the TCP assembly process for the COF packaging structure 150 shown in 1B of FIG. 1, and FIG. 7 is a diagram showing the TCP assembly process for the COF packaging structure 300 shown in FIG. 3. As shown in FIG. 6, a first CCD 610 is utilized for watching the COF packaging structure 150 to confirm a position A61 of the first designated pattern 122 of the first metal foil 120, and a second CCD 620 is utilized for watching the driver IC 140 to calibrate a position A62 of the bumps 142 of the driver IC 140. After that, a stage 640 inverts and carries the driver IC 140 to the position A61. Finally, the driver IC 140 is bonded onto the COF packaging structure 150, wherein the bumps 142 of the driver IC 140 are bonded onto position A61 of the first designated pattern 122 of the first metal foil 120. As shown in FIG. 7, the COF packaging structure 300 is inverted. A CCD 710 is utilized for watching the COF packaging structure 300 to confirm the position A71 of the first designated pattern 322 of the first conductive foil 320. Because the COF packaging structure 350 can be seen through, the same CCD 710 is utilized for watching the driver IC 340 through the second designated pattern 352 and the first designated pattern 322 to calibrate a position A72 of the bumps 342 of the driver IC 340. Following that, a stage 740 carries the driver IC 340 to the position A71. Finally, the driver IC 340 is bonded onto the COF packaging structure 300, wherein the bumps 342 of the driver IC 340 are bonded onto position A71 of the first designated pattern 322 of the first conductive foil 320. By comparing them, the COF packaging structure 300 disclosed in the present invention needs only one CCD 710 to bond the driver IC 340 on it, which reduces costs during the TCP assembly process.

Figure 8:
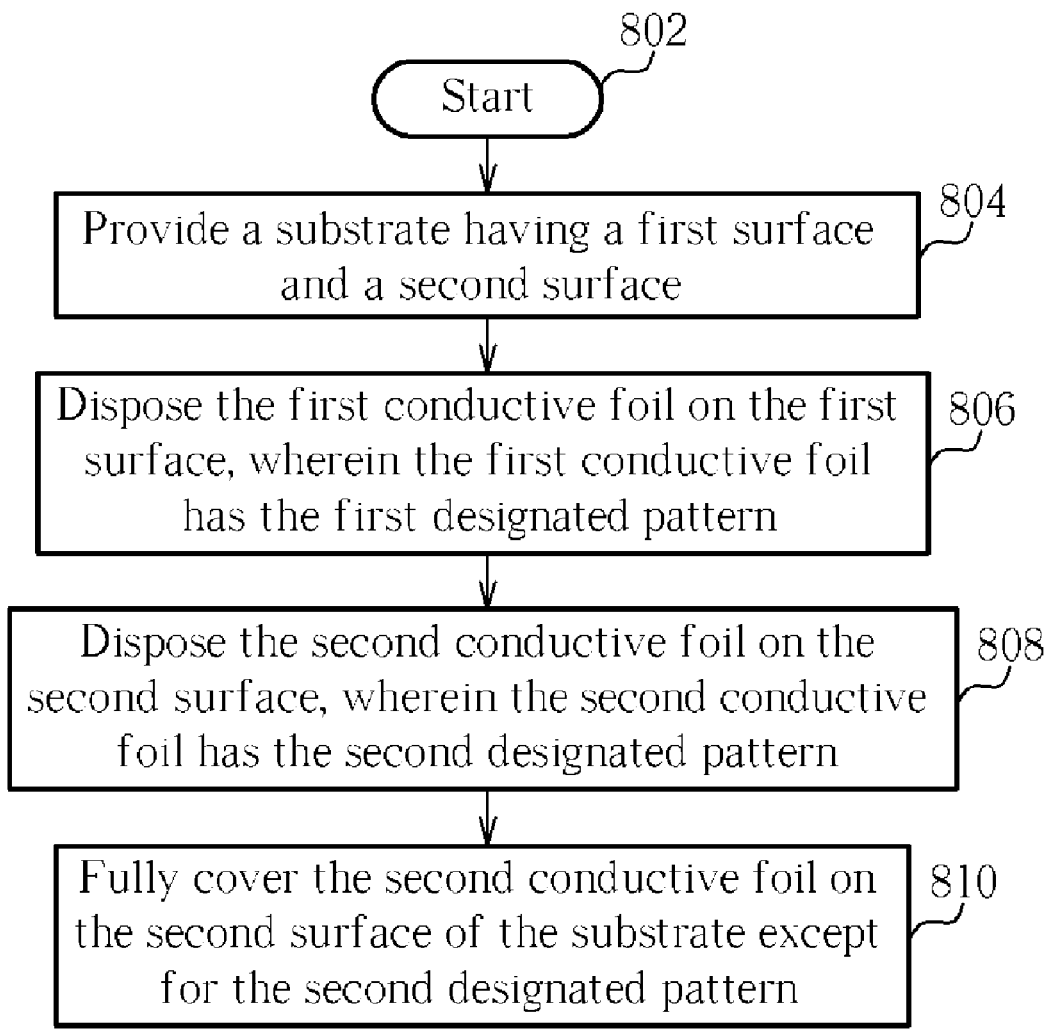
FIG. 8 is a flowchart illustrating a method of manufacturing a COF packaging structure according to an embodiment of the present invention.

Please refer to FIG. 8, which is a flowchart illustrating a method for manufacturing a COF packaging structure according to an embodiment of the present invention. Please note that the following steps are not limited to be performed according to the exact sequence shown in FIG. 8 if a roughly identical result can be obtained. The method includes the following steps:

Step 802: Start.

Step 804: Provide a substrate having a first surface and a second surface opposite to the first surface.

Step 806: Dispose a first conductive foil on the first surface of the substrate, wherein the first conductive foil has a first designated pattern for bump bonding.

Step 808: Dispose a second conductive foil on the second surface of the substrate, wherein the second conductive foil has a second designated pattern, and the area of the second designated pattern is not smaller than the area of the first designated pattern.

Step 810: Fully cover the second conductive foil on the second surface of the substrate except for the second designated pattern.

Please refer to FIG. 8 together with FIG. 3. The following description explains how to manufacture the COF packaging structure 300 by collocating the steps shown in FIG. 8 and the elements shown in FIG. 3. In Step 804, the substrate 310 having the first surface 312 and the second surface 314 opposite to the first surface 312 is provided. In Steps 806 through 808, the first conductive foil 320 having the first designated pattern 322 is disposed on the first surface 312 of the substrate 310, and the second conductive foil 350 having the second designated pattern 352 is disposed on the second surface 314 of the substrate 310, wherein the area of the second designated pattern 352 is not smaller than the area of the first designated pattern 322. In this embodiment, the second conductive foil 350 is fully covered on the second surface 314 of the substrate 310 except for the second designated pattern 352 (Step 810).

The abovementioned method is merely an exemplary embodiment of the present invention. In other embodiments, more steps are designated to provide the COF packaging structure with more modifications. Please refer to FIG. 9, a flowchart illustrating a method of manufacturing a COF packaging structure according to another embodiment of the present invention, which includes the following steps:

Step 802: Start.

Step 804: Provide a substrate having a first surface and a second surface opposite to the first surface.

Step 910: Design the second designated pattern.

Step 920: Dispose the first designated pattern on a first location of the first conductive foil and dispose the second designated pattern on a second location of the second conductive foil.

Step 806: Dispose the first conductive foil on the first surface of the substrate, wherein the first conductive foil has a first designated pattern for bump bonding.

Step 808: Dispose a second conductive foil on the second surface of the substrate, wherein the second conductive foil has a second designated pattern, and the area of the second designated pattern is not smaller than the area of the first designated pattern.

Step 930: Dispose a hole on the second conductive foil.

Step 940: Fully cover the second conductive foil on the second surface of the substrate except for the second designated pattern and the hole.

Figure 9:
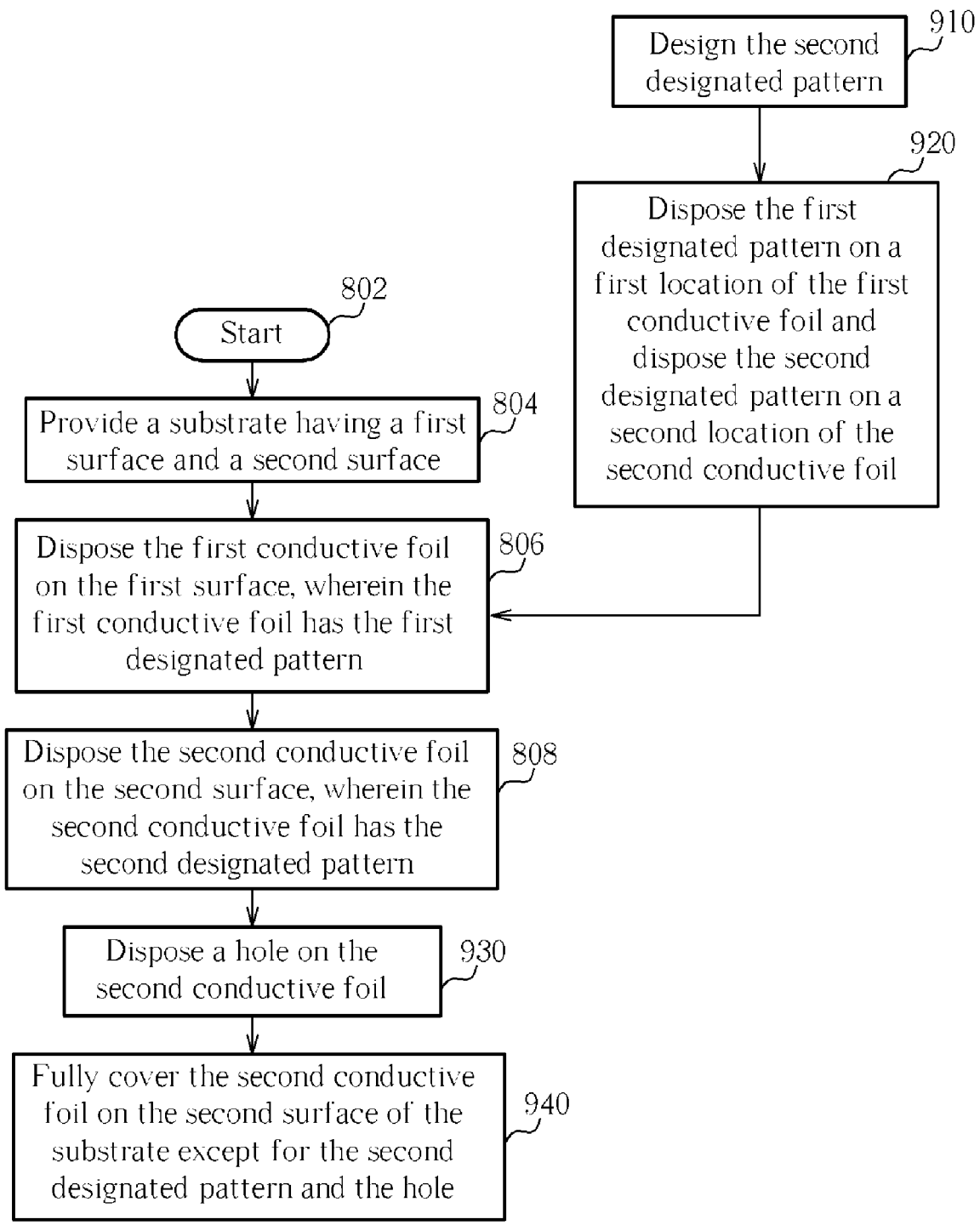
FIG. 9 is a flowchart illustrating a method of manufacturing a COF packaging structure according to another embodiment of the present invention.

The steps shown in FIG. 9 are similar to that in FIG. 8. The difference between them is that FIG. 9 further adds a pattern-designing step (i.e., Steps 910-920) and a hole-disposing step (i.e., Step 930) into the procedure. In Step 910, when the second designated pattern is designed the same as the first designated pattern, a COF packaging structure like the COF packaging structure 400 in 4A can be obtained. When the second designated pattern is designed different from the first designated pattern, a COF packaging structure like the COF packaging structure 450 in 4B can be obtained. Furthermore, when one or a plurality of holes are disposed on the second conductive foil, a COF packaging structure like the COF packaging structure disclosed in FIG. 5 (including 5A-5D) can be obtained.

Figure 10:
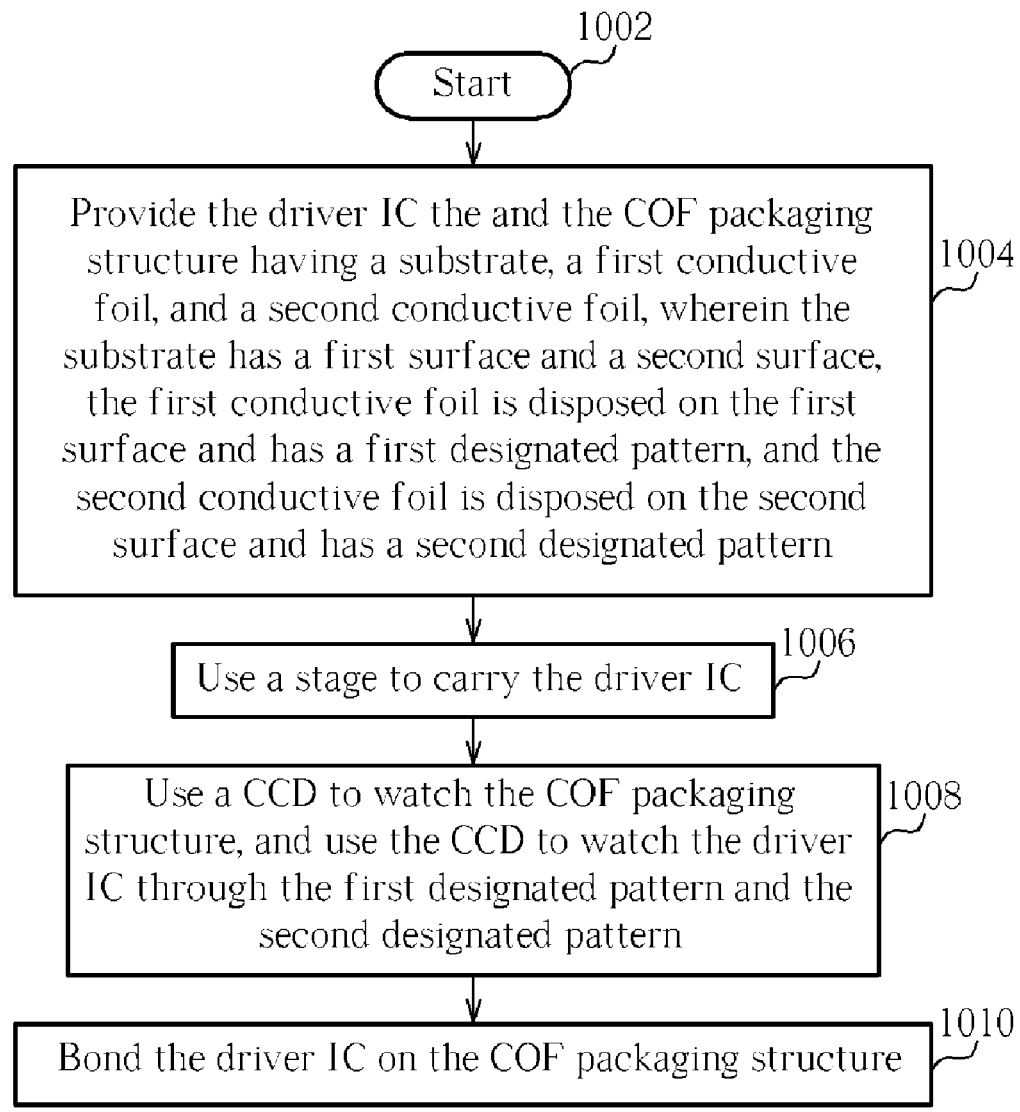
FIG. 10 is a flowchart illustrating a method for assembling an integrated circuit and a COF packaging structure according to an embodiment of the present invention.

Please refer to FIG. 10, which is a flowchart illustrating a method for assembling an integrated circuit and a COF packaging structure according to an embodiment of the present invention. The method includes the following steps:

Step 1002: Start.

Step 1004: Provide the driver IC the and the COF packaging structure having a substrate, a first conductive foil, and a second conductive foil, wherein the substrate has a first surface and a second surface opposite to the first surface, the first conductive foil is disposed on the first surface of the substrate and has a first designated pattern for bump bonding, and the second conductive foil is disposed on the second surface of the substrate and has a second designated pattern with an area not smaller than the area of the first designated pattern.

Step 1006: Utilize a stage to carry the driver IC.

Step 1008: Utilize a CCD to watch the COF packaging structure, and utilize the CCD to watch the driver IC through the first designated pattern and the second designated pattern for calibrating the driver IC.

Step 1010: Bond the driver IC on the COF packaging structure, wherein bumps of the driver IC are bonded on the first designated pattern of the first conductive foil.

In Steps 1002 through 1010, the operations are already detailed in FIG. 7, and further description is omitted here for brevity.

Provided that substantially the same result is achieved, the steps of the method shown in FIG. 8, FIG. 9, and FIG. 10 need not be in the exact order shown and need not be contiguous: other steps can be intermediate.

The abovementioned embodiments are presented merely for describing the present invention, and in no way should be considered to be limitations of the scope of the present invention. In summary, the present invention provides a COF packaging structure and a related method. The thermal dissipation capability of the COF packaging structure 300 is improved by adding the second conductive foil 350. Additionally, by adding the second designated pattern 352 into the second conductive foil 350, the COF packaging structure 300 can be seen-through by a CCD and the conventional IL bonder with only one charge coupled device (CCD) is suitable for the COF packaging structure 300. Therefore, not only can the thermal dissipation issue be solved, but by adopting the COF packaging structure disclosed in the present invention can also reduce costs during the TCP assembly process. Furthermore, as is well known by persons of ordinary skill in the art, suitable variations can be applied to the second conductive foils without departing from the spirit of the present invention. For example, one or a plurality of holes with different types can be disposed on the second conductive foil for easily attaching elements or objects with miscellaneous shapes on the substrate, which should also belong to the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for assembling a driver integrated circuit (IC) and a COF packaging structure, comprising:
    providing the driver IC the and the COF packaging structure having a substrate, a first conductive foil, and a second conductive foil, wherein the substrate has a first surface and a second surface opposite to the first surface, the first conductive foil is disposed on the first surface of the substrate and has a first designated pattern for bump bonding, and the second conductive foil is disposed on the second surface of the substrate and has a second designated pattern having an area not smaller than an area of the first designated pattern;
    utilizing a stage to carry the driver IC;
    utilizing a charge coupled device (CCD) to watch the COF packaging structure, and utilizing the CCD to watch the driver IC through the first designated pattern and the second designated pattern for calibrating the driver IC; and
    bonding the driver IC on the COF packaging structure, wherein bumps of the driver IC are bonded on the first designated pattern of the first conductive foil.

2. The method of claim 1, wherein a projection area of the first designated pattern on the substrate is within a projection area of the second designated pattern on the substrate.

3. The method of claim 1, wherein the second designated pattern is substantially identical to the first designated pattern.

4. The method of claim 1, wherein the second conductive foil is fully covered on the second surface of the substrate except for the second designated pattern.

* * * * *